United States Patent [19]
Ginetti

[11] Patent Number: 5,600,319
[45] Date of Patent: Feb. 4, 1997

[54] THERMOMETRIC-TO-DIGITAL-TO-ANALOG CONVERTER OCCUPYING REDUCED CHIP AREA

[75] Inventor: Bernard Ginetti, Antibes, France

[73] Assignee: YLSI Technology, Inc., San Jose, Calif.

[21] Appl. No.: 333,008

[22] Filed: Nov. 1, 1994

[51] Int. Cl.$^6$ .................................................. H03M 1/66
[52] U.S. Cl. .......................................... 341/144; 341/136
[58] Field of Search ...................................... 341/135, 136, 341/144

[56] References Cited

U.S. PATENT DOCUMENTS

| | | | |
|---|---|---|---|
| 4,667,178 | 5/1987 | Ryu | 341/144 |
| 4,725,813 | 2/1988 | Miyada | 341/136 |
| 5,105,193 | 4/1992 | Vogt et al. | 341/154 |
| 5,181,034 | 1/1993 | Takakura et al. | 341/144 |
| 5,254,994 | 10/1993 | Takakura et al. | 341/153 |
| 5,339,078 | 8/1994 | Vernon | 341/136 |
| 5,423,743 | 9/1995 | Kang | 341/144 |

*Primary Examiner*—Marc S. Hoff
*Attorney, Agent, or Firm*—Burns, Doane, Swecker & Mathis

[57] ABSTRACT

A digital-analog converter incorporates an array of current source cells connected at the output to a load as a function of an input code subdivided into H and V values, which are most significant bit (MSB) and least significant bit (LSB), respectively. The input code is converted into thermometric codes, respectively HT and VT, whose logic inverses are respectively horizontally and vertically routed to the array. Each position cell (h, v) in the array comprises a first and a second P type metal oxide semiconductor field effect transistor connected in series, and the series is in parallel with at least one third P type metal oxide semiconductor field effect transistor.

7 Claims, 2 Drawing Sheets

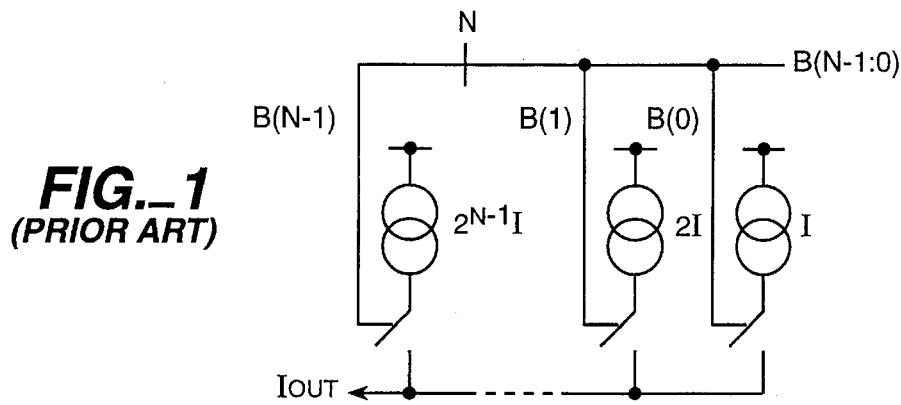
FIG._1
*(PRIOR ART)*
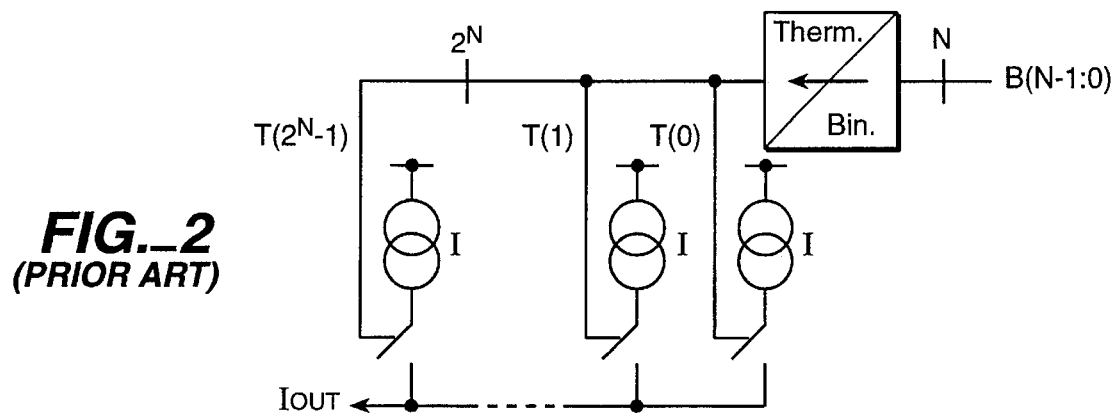
FIG._2
*(PRIOR ART)*
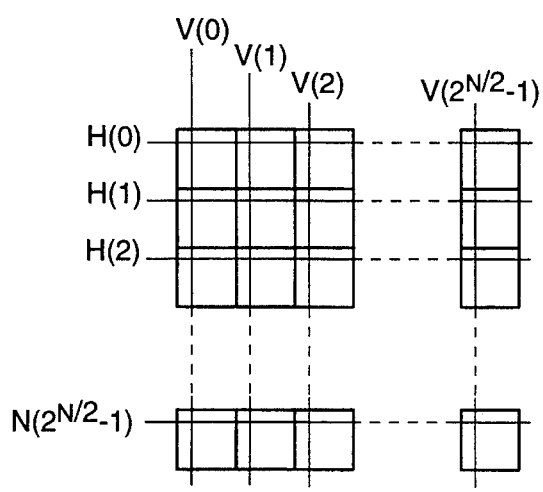
FIG._3
*(PRIOR ART)*
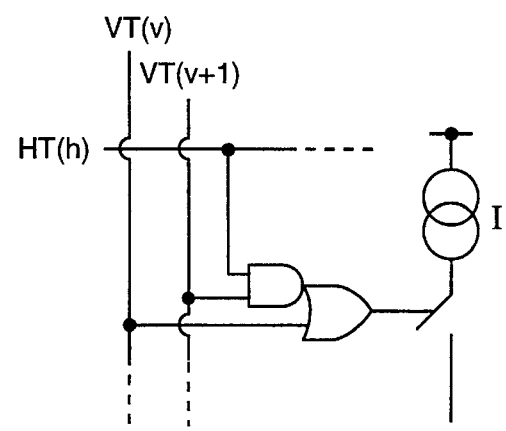
FIG._4
*(PRIOR ART)*

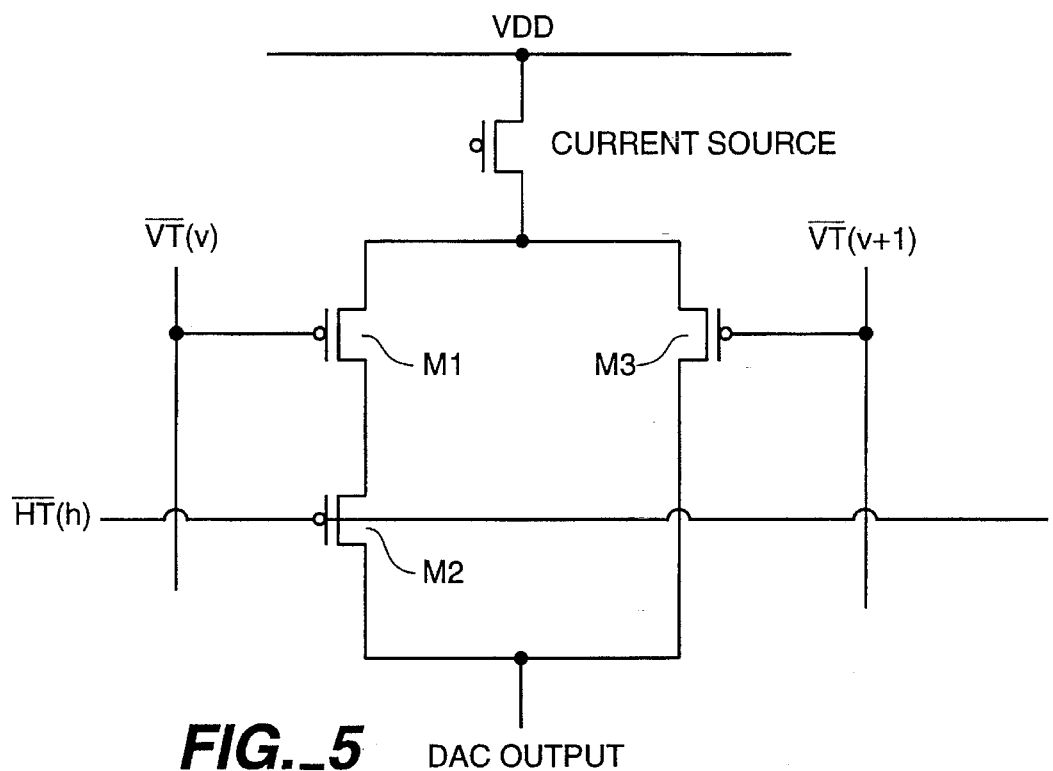
FIG._5
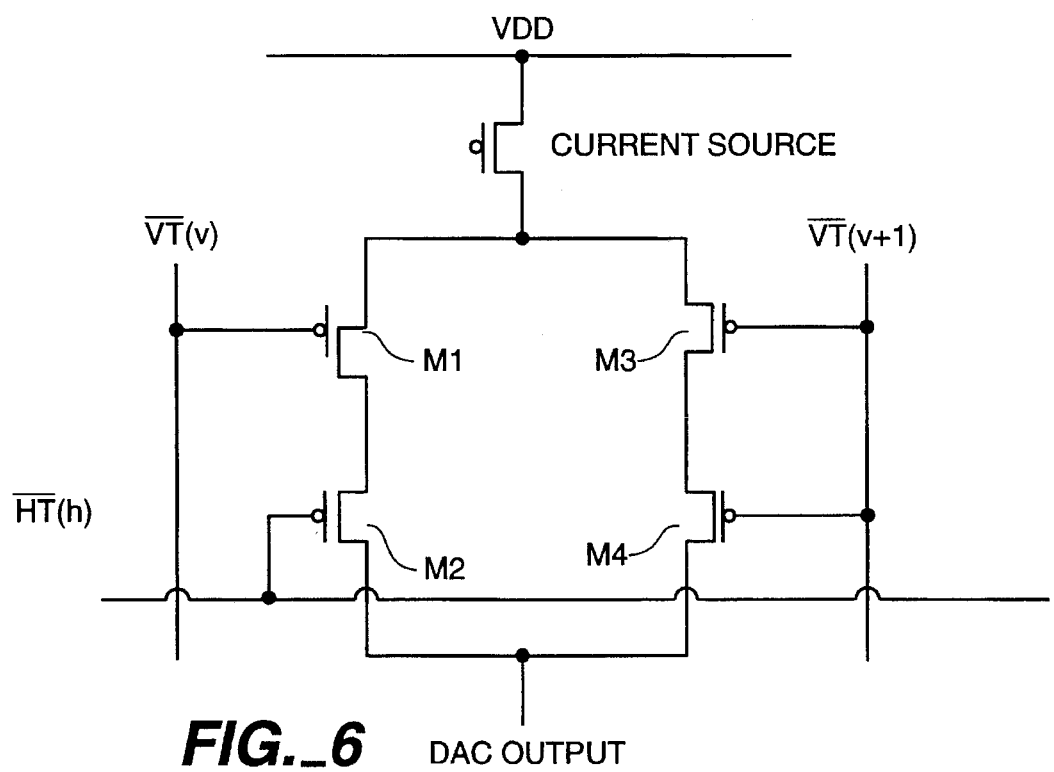
FIG._6

THERMOMETRIC-TO-DIGITAL-TO-ANALOG CONVERTER OCCUPYING REDUCED CHIP AREA

TECHNICAL FIELD

The present invention relates to a digital-analog converter.

BACKGROUND OF THE INVENTION

In prior art devices, such as in the digital-analog converter (DAC) described in the article by Jean Michel Fournier and Patrice Senn entitled "A 130 MHz 8-b CMOS video DAC for HDTV Application" (IEEE Journal of Solid-State Circuits, volume 26, No. 7, July 1991, pages 1073–1077), one of the methods used for producing a digital-analog converter (DAC) consists of using an array of current sources connected to a load in accordance with an input code of the DAC. Two methods are widely used for obtaining a given resolution of N bits.

1) Use is made of an array of N binary weighted sources controlled directly by the N bits of the input code, as shown in FIG. 1.
2) Use is made of an array of $2^N$ unit sources controlled by the thermometric conversion of the input code, as shown in FIG. 2

The first solution provides the smallest and fastest configuration, but a matching to N bits of the current sources is necessary in order to ensure monotonicity.

The second solution ensures monotonicity regardless of the matching, but requires a large silicon area which does not correspond to the actual current sources. Even in the case of binary weighted sources, the latter are formed by unit cells in parallel for matching reasons. The increased area is due to the logic necessary for the series selection of each source.

In a typical digital-to-analog converter, as shown in FIG. 3: an N bit input code B[N-1:0] is subdivided into MSB (Most Significant Bits) and LSB (Least Significant Bits), respectively H and V:

$$H\left[\frac{N}{2}-1:0\right]=B\left[\frac{N}{2}-1:0\right]$$

$$V\left[\frac{N}{2}-1:0\right]=B\left[N-1:\frac{N}{2}\right].$$

The codes H and V are converted into thermometric codes, respectively HT and VT:

HT[$2^N$-1:0] with HT[j]=1 for j≤val(H) and HT[j]=0 for j>val(H)

VT[$2^N$-1:0] with VT[j]=1 for j≤val(V) and VT[j]=0 for j>val(V)

The bits of HT and VT codes are respectively horizontally and vertically routed to the source array. A source located in position (h,v) is excited (i.e. its current is supplied to the load) in accordance with the condition:

(HT[h] AND VT[v])

Starting with a zero input code on the DAC, only HT[0] and VT[0] are brought to "1". The only selected source in the array is that of the upper left-hand corner. By increasing the code up to the least MSB, all the sources of the first left-hand column are progressively selected When the smallest MSB assumes the value "1", VT[1] is brought to "1". All of the sources of the first column are maintained selected and the sources of the second column are progressively excited (turned on) and so on.

The AND-OR logic necessary for implementing the aforementioned condition is alongside each current source and controls a switch in series with the source, as shown in FIG. 4. In practice, the area occupied by the DAC is dominated by the AND-OR gates.

The object of the present invention is to reduce the area of the thermometric-type common DAC, while maintaining its inherent monotonicity and therefore increasing at the same time the integral linearity of the converter due to the improved matching of the near unit sources.

SUMMARY OF THE INVENTION

The present invention is directed to a digital-analog converter incorporating an array of current source cells connected at their outputs to a load as a function of an input code. The input code is subdivided into respectively H and V, most significant bit (MSB) and least significant bit (LSB) values, and is converted into thermometric codes, respectively HT and VT, whose logic inverses are respectively horizontally and vertically routed to the current source array. Each position cell (h, v) includes a first and a second P type metal oxide semiconductor field effect transistor in series, in parallel with at least one third P type metal oxide semiconductor field effect transistor.

Preferably the gate of the second transistor receives a signal $\overline{HT}(h)$, and the gate of the third transistor receives a signal $\overline{VT}(v+1)$. One current source is connected between the drains of the first and third P type metal oxide semiconductor field effect transistors and a polarization voltage VDD and the output signal is obtained on the source of the second P type metal oxide semiconductor field effect transistor.

Preferably, the current source has a P type metal oxide semiconductor field effect transistor, e.g. a long channel transistor (i.e., having a relatively high impedance).

Preferably, the first, second and third P type metal oxide semiconductor field effect transistors are wide channel transistors (i.e., having a relatively low impedance).

In a first embodiment the first transistor receives a signal $\overline{VT}(v)$ of its gate.

In a second embodiment a fourth P type metal oxide semiconductor field effect transistor is arranged in series with the third transistor, in parallel with the two first transistors. The fourth transistor receives the signal $\overline{VT}(v+1)$ at its gate. In addition, the first transistor receives a signal $\overline{VS}(v)$ on its gate. The signal VS is a decoded $2^N$ conversion of V, defined as:

VS[j]=1 for j=val(v) and VS(j)=0 for j≠val(v).

The invention provides the following advantages:
reduced area for a thermometric-type current DAC;
improved matching of the current sources, because they are nearer, and thus a greater integral linearity for the DAC;
reduced power for supplying the control signals (due to four PMOS switches instead of six CMOS transistors).

BRIEF DESCRIPTION OF THE DRAWINGS

FIGS. 1 to 4 illustrate different prior art devices.

FIG. 5 illustrates a first embodiment of the device according to the invention.

FIG. 6 illustrates a second embodiment of the device according to the invention.

DETAILED DESCRIPTION OF THE PREFERRED EMBODIMENTS

The digital-analog converter (DAC) according to the invention includes an array of current source cells having outputs connected to a load as a function of an input code. The input code is subdivided into H and V, values (most significant and least significant bits, respectively), and converted into thermometric codes, respectively HT and VT, whose logic inverses are respectively horizontally and vertically routed to the array. According to the first embodiment, each position cell defined by values (h, v) includes, as shown in FIG. 5, first and second PMOS (P type metal oxide semiconductor field effect transistor) (M1, M2) connected in series, and in parallel with a third PMOS transistor (M3). The gate of the first transistor receives a signal $\overline{VT}(v)$, the gate of the second transistor receives a signal $\overline{HT}(h)$, and the gate of the third transistor receives a signal $\overline{VT}(v+1)$. A current source, e.g. a PMOS transistor, is connected between the drains of the first and third PMOS transistors and a voltage VDD. The output signal is obtained from the source of the second PMOS transistor.

In this embodiment of the invention, the transistors are PMOS transistors for controlling the current source. A simple improvement of the AND-OR function by means of PMOS switches is shown in FIG. 5, using inverse thermometric codes $\overline{HT}$ and $\overline{VT}$.

However, such a construction leads to three conductor modes for the current source. As a function of the input code, the current can flow solely through the transistors M1 and M2, solely through the transistor M3, or through transistors M1/M2 and M3. The variable impedance of the conductor path affects the current source, and can reduce the monotonicity.

In order to reduce this effect, a high output impedance source (long transistor) and high conductance PMOS switches (wide transistors) must be used, which increases the size of the leaf cell and the load connected to the control signals $\overline{HT}$ and $\overline{VT}$, which also increases the power required. Moreover, it prevents the use of switches such as cascode devices in order to increase the output impedance of the DAC.

Alternatively, in each leaf cell, an array of four switches can replace the AND-OR gate shown in FIG. 4, which requires a separate well P (P-well) and a rail voltage VSS. Thus, this variant is based on a supplementary control signal VS, which is the V decodes $2^N$ conversion:

VS[j]=1 for j=val(V) and VS[j]=0 for j≠val(V)

The inverse logic words $\overline{HT}$ and $\overline{VS}$ are routed vertically on the source array, whereas $\overline{HT}$ is shifted horizontally. A complete leaf cell of the DAC is constituted by a current source and four switches, as shown in FIG. 6.

VS[v] and VT[v+1] are never on at the same time and the current can flow either through transistors M1 and M2 only, or through transistors M3 and M4 only. The transistor M4 is a dummy used only for matching the impedance of the transistors M1 and M2. Moreover, the signals $\overline{VT}$, $\overline{VS}$ and $\overline{HT}$ do not use the logic levels [VSS, VDD]. They are always brought to VDD (switch off) or to a polarization voltage (switch on), which keeps the PMOS transistor saturated. Thus, they act like a cascode device for increasing the output impedance of the DAC.

Such a construction makes it possible to obtain a reduced size converter having a better current source matching and therefore a greater integral linearity, while reducing the power required for conducting the control signals.

I claim:

1. A digital-to-analog converter, comprising:

an array of current source cells, each cell having an output connected to a load as a function of an input code converted into a thermometric code including signals HT and VT, wherein logic inverses of the thermometric code are supplied to each cell in the array to selectively connect the cell to the load, and wherein each cell includes a first and a second P type metal oxide semiconductor field effect transistor connected in series, the series connected in parallel with one or more third P type metal oxide semiconductor field effect transistors, wherein the gate of the second transistor receives a signal $\overline{HT}(h)$, the gate of the third transistor receives a signal $\overline{VT}(v+1)$, wherein one current source is connected between the drains of the first and third P type metal oxide semiconductor field effect transistors and a polarization voltage VDD and wherein the cell output is obtained on the source of the second P type metal oxide semiconductor field effect transistor.

2. The digital-to-analog converter according to claim 1, wherein the one current source includes a P type metal oxide semiconductor field effect transistor.

3. The digital-to-analog converter according to claim 1, wherein the first transistor receives a signal $\overline{VT}(v)$ on its gate.

4. The digital-to-analog converter according to claim 1, wherein a fourth P type metal oxide semiconductor field effect transistor is arranged in series with the third transistor and in parallel with the two first transistors, the fourth transistor receiving the signal $\overline{VT}(v+1)$ on its gate.

5. A digital-to-analog converter, comprising:

an array of current source cells, each cell having an output connected to a load as a function of an input code converted into a thermometric code including signals HT and VT, wherein logic inverses of the thermometric code are supplied to each cell in the array to selectively connect the cell to the load, and wherein each cell includes a first and a second metal oxide semiconductor field effect transistor connected in series, the series connected in parallel with a third and a fourth metal oxide semiconductor field effect transistor, wherein current does not flow through the first and the second transistors and the third and the fourth transistors at the same time.

6. A converter according to claim 5, wherein the gate of the second transistor receives a signal $\overline{HT}(h)$, the gate of the third transistor receives a signal $\overline{VT}(v+1)$, wherein one current source is connected between the drains of the first and third metal oxide semiconductor field effect transistors and a polarization voltage VDD and wherein the cell output is obtained on the source of the second metal oxide semiconductor field effect transistor.

7. A converter according to claim 5, wherein the fourth transistor is selected to match an impedance of the first and the second transistors.

* * * * *